United States Patent [19]

Goser

[11] 4,038,676

[45] July 26, 1977

[54] PAIR OF BIPOLAR TRANSISTORS HAVING BASE ZONES WHICH ARE ELECTRICALLY CONDUCTIVELY CONNECTED TO ONE ANOTHER, AND A PROCESS FOR PRODUCING THE PAIR OF TRANSISTORS

[75] Inventor: Karl Goser, Munich, Germany

[73] Assignee: Siemens Aktiengesellschaft, Berlin & Munich, Germany

[21] Appl. No.: 634,038

[22] Filed: Nov. 21, 1975

[30] Foreign Application Priority Data

Dec. 19, 1974  Germany .............................. 2460269

[51] Int. Cl.² ................... H01L 29/72; H01L 29/48; H01L 29/56; H01L 29/64

[52] U.S. Cl. ........................................ 357/34; 357/35; 357/36; 357/15; 357/43

[58] Field of Search ................... 357/34, 35, 36, 43, 357/48, 15

[56] References Cited

U.S. PATENT DOCUMENTS

| 3,299,281 | 1/1967 | Cluwen ................................ 357/35 |
| 3,340,601 | 9/1967 | Garibotti .............................. 357/35 |
| 3,524,113 | 8/1970 | Augusta et al. ..................... 357/35 |
| 3,602,981 | 9/1971 | Kooi ................................... 357/35 |
| 3,898,483 | 8/1975 | Sander et al. ...................... 357/35 |
| 3,913,123 | 10/1975 | Masaki et al. ..................... 357/34 |

FOREIGN PATENT DOCUMENTS 1,283,785  12/1961  France .................................. 357/36

Primary Examiner—Andrew J. James
Attorney, Agent, or Firm—Hill, Gross, Simpson, Van Santen, Steadman, Chiara & Simpson

[57] ABSTRACT

A pair of bipolar transistors are formed in a semiconductor substrate with each transistor having at least one emitter, one base and at least one collector. At least the base is in the form of a doped zone in the substrate. The two base zones are electrically conductively connected to one another and the transistors are constructed or arranged in the substrate in such a manner that in each case free boundary faces of the two base zones lie opposite one another. The base connection is formed by an additionally doped zone in the interspace between the base zones, the doped zone having the same type of doping as the base zones.

9 Claims, 4 Drawing Figures

PAIR OF BIPOLAR TRANSISTORS HAVING BASE ZONES WHICH ARE ELECTRICALLY CONDUCTIVELY CONNECTED TO ONE ANOTHER, AND A PROCESS FOR PRODUCING THE PAIR OF TRANSISTORS

BACKGROUND OF THE INVENTION

1. Field of the Invention

The present invention relates to a pair of bipolar transistors in a semiconductor substrate, in which each transistor has at least one emitter, one base and at least one collector, and more particularly to such an arrangement in which at least the base is in the form of a doped zone in the substrate and in which the two base zones are electrically conductively connected to each other.

2. Description of the Prior Art

In an earlier patent application, P 24 51 579.5 base-coupled logic circuits for switching processes in the sub-nanosecond range were proposed. As the heart of these elements, these base-coupled logic circuits contain a pair of base-coupled transistors, i.e. a pair of transistors in which the two base zones are electrically conductively connected to each other. The use of such a pair of base-coupled transistors is based upon the recognition that a transistor which is operated as a current switch, switches over particularly rapidly when a high-speed establishment and disestablishment of the base charge in the relevant transistor is to be ensured. This can be achieved by a pair of base-coupled transistors. Very short switching times are attained if the base connection is as short and as low-ohmic as possible.

SUMMARY OF THE INVENTION

The object of the present invention is to provide pairs of transistors of the type mentioned above in which the base connection is as short and as low-ohmic as possible.

This object is realized in a construction in which the transistors are constructed or arranged in the substrate in such a manner that, in each case, free boundary faces of the two base zones lie opposite each other, and in such a manner that the base connection is formed by an additionally doped zone in the interspace between the base zones, the additionally doped zone having the same type of doping as the base zones.

A particularly advantageous embodiment of the invention is one in which the emitter, base and collector of each transistor are in the form of doped paths which extend in parallel to each other and which are immediately adjacent to each other. Further, the two transistors are arranged in two parallel planes and the base connection is in the form of a doped path running in parallel to the two base paths.

Another particularly advantageous embodiment of the invention is one in which the emitter or collector and the base of each transistor are in the form of doped paths in the substrate, and the collector or the emitter, respectively, are in the form of a Schottky contact designed as a metal path extending above the base path. The two transistors are arranged next to one another in such a manner that the two metal paths face each other and the additionally doped zone is in the form of a doped path beneath the interspace between the two metal paths.

The advantages of the invention reside in the particularly simple construction and the in the resultant easy integration in a semiconductor substrate. It is therefore possible to form concepts for the integration of base-coupled logic circuits. The invention also enables extremely short switching times to be achieved.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
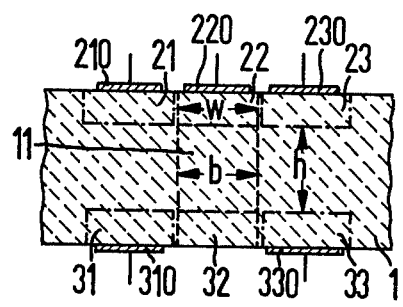
FIG. 1 is a schematic illustration, in cross-sectional form, of a pair of base-coupled transistors in a thin semiconductor layer.

Referring to FIG. 1, the drawing schematically illustrates, in cross-section, a pair of base-coupled transistors in a thin semiconductor layer 1. The transistors, which constitute the pairs of transistors, are arranged beneath a surface and beneath the opposite surface of the semiconductor layer 1.

More specifically, each transistor comprises an emitter or collector path 21, 31, and adjacent base path 22, 32 and an adjacent collector or emitter path 23, 33, respectively. The extent of the paths 21, 22, 23, 31, 32, 33 is assumed to be perpendicular to the plane of the drawing.

The two transistors are arranged in such a manner that, in each case, one exposed boundary face lies opposite each base path. Here, "exposed boundary face of a base path" is defined as and is to be understood to be a boundary face which does not bear against a collector or an emitter.

The two base paths 22 and 32 of the two transistors are connected to each other by an additionally doped path 11 which, in turn, extends at right angles to the plane of the drawing. The additionally doped path 11 has the same type of doping as the base path. The width $b$ of the additionally doped path 11 is preferably selected to be equal to the base width $w$. The height $h$ of the additionally doped path 11 is equal to the distance between the two base paths. The height $h$ is preferably selected to be such that at the maximum it amounts to half the length of a base path.

The emitter and collector terminals are formed from the ohmic contacts 210, 230, 310 and 330. All that is required for the base terminal is an ohmic contact 220 which is arranged over a base path. Advantageously, the doping of the path 11 is selected to be at least equal to the doping of the base paths. With regard to the production of an arrangement represented in FIG. 1, it is expedient that the entire semiconductor layer, with the exception of the collector and emitter paths of the two transistors, should possess uniform doping.

Figure 2:
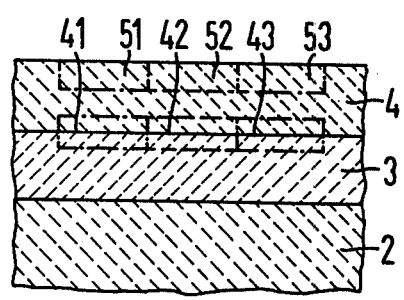
FIG. 2 is a schematic illustration, in cross sectional form, of a pair of base-coupled transistors formed in solid silicon.

Referring to FIG. 2, a schematic illustration, in cross section, of a pair of base-coupled transistors in solid silicon is illustrated. Above a solid silicon body 2, which, for example, is n-doped, is arranged a first p-doped, epitaxial silicon layer 3 on which is arranged a second p-doped epitaxially grown silicon layer 4. At the boundary between the first and second epitaxial layes, emitter, base and collector elements of a first bipolar transistor are arranged as doped paths 41, 42 and 43. These doped paths extend at right angles to the plane of the drawing. The second transistor of the pair is arranged directly beneath the surface of the layer 4, and the emitter, the base and the collector are again represented as doped paths 51, 52 and 53 which extend at right angles to the plane of the drawing.

In the arrangement represented in FIG. 2, generally one proceeds in such a manner that a first epitaxial layer of one doping is arranged on the surface of a doped silicon semiconductor substrate which has an opposite doping. The emitter and the collector of the first transistor are applied as doped zones to this epitaxial layer, and then a second epitaxial layer is applied. Then, the emitter and collector of the second transistor are applied, as doped zones, to the second epitaxial layer. The base connection then automatically exits. Emitter, base and collector zones of the second transistor are subsequently provided with ohmic contacts, whereas emitter and collector zones of the first transistor are electrically conductively connected at the ends of the paths by at least one doped zone having ohmic contacts on the surface thereof.

Figure 3:
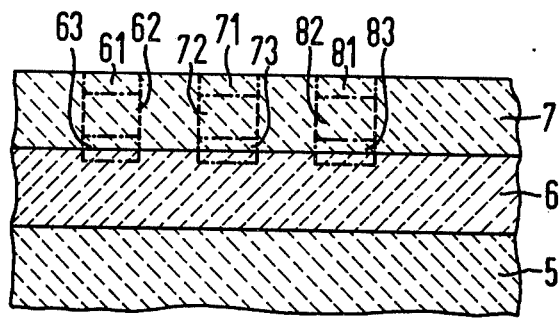
FIG. 3 is a schematic illustration, again in cross sectional form, of an arrangement of a plurality of pairs of base-coupled transistors in solid silicon.

FIG. 3 illustrates, in cross-section, an arrangement having a plurality of base-coupled transistor pairs. Arranged on a solid, doped semiconductor substrate 5 of a first type of doping is a first doped epitaxial layer 6, having a second type of doping. Above the epitaxial layer 6 is arranged a second, epitaxially grown doped layer 7 of the second type of doping. At the boundary between the first and second epitaxial layers, parallel paths 63, 73 and 83 which have a first doping and which run at right angles to the plane of the drawing are arranged at intervals. Above these paths, beneath the surface of the second epitaxial layer 7, doped paths 61, 71 and 81 are arranged and extend parallel to the lower paths.

In contrast to the construction illustrated in FIG. 2, the lower paths are employed as collectors or emitters, respectively, whereas the upper paths are operated as emitters or collectors, respectively. The individual transistors are therefore at right angles to the surface of the epitaxial layer 7 and the base zones of the individual transistors are formed by the zones 62, 72 and 82. The base connection is again automatically formed by the doped zone between the individual transistors. The base terminal of the first base-coupled transistor pair, consisting of the left and the central vertical transistors, is advantageously designed as an ohmic contact directly on the left of the doped path 61, whereas the base terminal for the second pair of transistors, consisting of the central transistor and the right transistor is advantageously designed as an ohmic contact directly on the right of the doped path 81. The production and the design of the collector and emitter terminals is as illustrated in FIG. 2.

Figure 4:
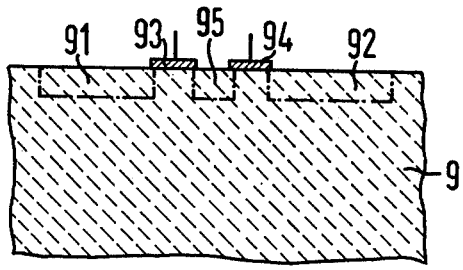
FIG. 4 is a schematic illustration, again in cross sectional form, of a pair of base-coupled transistors in a semiconductor substrate, in which the collector or the emitter of the transistors are in the form of Schottky contacts.

FIG. 4 schematically illustrates a cross-section through a pair of base-coupled transistors in a doped semiconductor substrate. The emitters or collectors of the two transistors are in the form of paths which have the opposite doping to the substrate and which extend at right angles to the plane of the drawing. The collectors or emitters of the two transistors are in the form of Schottky contacts designed as metal paths 93, 94 on the surface of the semiconductor substrate. These Schottky contacts of the two transistors are arranged to face each other, i.e. the doped paths 91 and 92 are arranged on both sides of the exterior of the pair of contacts 93, 94. The base zones of the two transistors are located directly beneath these Schottky contacts. The base zone is established by a doped path 95 beneath the interspace between the two metal paths 93 and 94. This doping is of the same type as the substrate doping and at least exhibits a degree of doping equal to that of the substrate. It should be ensured that the width of the metal paths and of the interspace therebetween be made as small as possible. It is advantageous to provide that this width is at the maximum half the length of a metal path.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A transistor arrangement comprising:
   a semiconductor substrate,
   a pair of lateral bipolar transistors superposed and spaced apart in said substrate,
   each of said transistors including a base zone, an emitter zone and a collector zone superposed with the like zones of the other transistor, at least said base zone of each transistor being a doped zone in said substrate and each of said base zones electrically conductively connected together,
   each of said base zones having a free boundary face line opposite the like face of the other base, and
   a doped connection zone in said substrate of the same type of doping as said base zones extending between and connecting said base zones.

2. The transistor arrangement of claim 1, wherein said emitter zone, collector zone and base zone of each of said transistors are parallel extending adjacent doped strips.

3. The transistor arrangement of claim 1, wherein said semiconductor substrate is doped in the same manner as the base zones over a predetermined range and wherein both of said transistors lie completely within said range.

4. A transistor arrangement comprising
   a semiconductor substrate,
   a pair of bipolar transistors spaced apart in said substrate,
   each of said transistors including an emitter zone at a surface of said substrate, a base zone below said emitter zone and a collector zone below said base zone, at least said base zone of each transistor being a doped zone in said substrate doped similarly to the other base zone, and each of said zones facing the like zones of the other transistor so that each of said base zones has a free boundary face lying opposite the like face of the other base, and
   a doped connection zone in said substrate of the same type of doping as said base zones, said doped connection zone extending between and connecting said base zones.

5. The transistor arrangement of claim 4, wherein said emitter zone, collector zone and base zone of each said transistor are parallel extending adjacent doped strips.

6. The transistor arrangement of claim 4, wherein said semiconductor substrate is doped in the same manner as the base zones over a predetermined range and wherein both of said transistors lie completely within said range.

7. A transistor arrangement comprising
a semiconductor substrate,
a pair of lateral bipolar transistors on a surface of said substrate,
each of said transistors comprising a doped conduction zone at said surface of said substrate which may serve as a collector or as an emitter, an oppositely doped base zone at said surface spaced from said doped conduction zone, and a Schottky contact mounted on said surface directly on said base zone and serving as an emitter or a collector, respectively, and
a boundary zone extending between and connecting said base zones, said boundary zone doped in the same manner as said base zones.

8. The transistor arrangement of claim 7, wherein said doped conduction zone and said base zone of each transistor are parallel extending strip-shaped zones and said Schottky contact of each transistor is a strip-shaped contact.

9. The transistor arrangement of claim 7, wherein said semiconductor substrate is doped in the same manner as said base zones over a predetermined range and wherein both of said transistors lie completely within said range.

* * * * *